US012564025B2

(12) United States Patent
Lin

(10) Patent No.: US 12,564,025 B2
(45) Date of Patent: Feb. 24, 2026

(54) INTERCONNECT WITH REDEPOSITED METAL CAPPING AND METHOD FORMING SAME

(71) Applicant: Taiwan Semiconductor Manufacturing Co., Ltd., Hsinchu (TW)

(72) Inventor: Hsiang-Wei Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 927 days.

(21) Appl. No.: 17/646,770

(22) Filed: Jan. 3, 2022

(65) Prior Publication Data

US 2023/0048536 A1 Feb. 16, 2023

Related U.S. Application Data

(60) Provisional application No. 63/232,747, filed on Aug. 13, 2021.

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/76849* (2013.01); *H01L 21/76844* (2013.01); *H01L 21/76846* (2013.01); *H01L 21/76865* (2013.01); *H01L 21/76868* (2013.01); *H01L 23/5226* (2013.01); *H01L 23/5283* (2013.01); *H01L 23/53238* (2013.01); *H01L 23/53266* (2013.01); *H01L 2221/1063* (2013.01)

(58) Field of Classification Search
CPC ......... H01L 21/76849; H01L 21/76865; H01L 21/76868; H01L 21/76844
See application file for complete search history.

(56) References Cited

U.S. PATENT DOCUMENTS

| | | | | |
|---|---|---|---|---|
| 6,656,841 B1 * | 12/2003 | Kim | .................. | H01L 21/76844 |
| | | | | 438/626 |
| 7,368,377 B2 * | 5/2008 | Whelan | .................. | B82Y 30/00 |
| | | | | 257/E21.171 |
| 10,497,613 B2 * | 12/2019 | Chawla | ............. | H01L 21/76834 |
| 11,676,898 B2 * | 6/2023 | Kuo | .................. | H01L 21/02458 |
| | | | | 257/751 |
| 11,764,157 B2 * | 9/2023 | Xu | .................... | H01L 21/76844 |
| | | | | 257/751 |

(Continued)

*Primary Examiner* — Daniel Luke
(74) *Attorney, Agent, or Firm* — Slater Matsil, LLP

(57) ABSTRACT

A method includes forming a first conductive feature in a first dielectric layer, forming a first metal cap over and contacting the first conductive feature, forming an etch stop layer over the first dielectric layer and the first metal cap, forming a second dielectric layer over the etch stop layer; and etching the second dielectric layer and the etch stop layer to form an opening. The first conductive feature is exposed to the opening. The method further includes selectively depositing a second metal cap at a bottom of the opening, forming an inhibitor film at the bottom of the opening and on the second metal cap, selectively depositing a conductive barrier in the opening, removing the inhibitor film, and filling remaining portions of the opening with a conductive material to form a second conductive feature.

20 Claims, 15 Drawing Sheets

(56)  References Cited

U.S. PATENT DOCUMENTS

| 2006/0163739 A1* | 7/2006 | Komai | ............. | H01L 23/53238 |
| | | | | 257/762 |
| 2010/0078821 A1 | 4/2010 | Kahlert et al. | | |
| 2020/0144107 A1 | 5/2020 | Dutta et al. | | |
| 2020/0347493 A1* | 11/2020 | Liu | ......................... | C23C 16/34 |
| 2021/0317570 A1* | 10/2021 | Yoon | ................ | C23C 16/45553 |
| 2021/0391275 A1* | 12/2021 | Kuo | ................. | H01L 23/53238 |

* cited by examiner

100

36

34

32
28
30
26

24

23

22

20

INTERCONNECT WITH REDEPOSITED METAL CAPPING AND METHOD FORMING SAME

PRIORITY CLAIM AND CROSS-REFERENCE

This application claims the benefit of the following provisionally filed U.S. Patent application: Application No. 63/232,747, filed on Aug. 13, 2021, and entitled "Novel Metal Re Dep. Flow for Low R Performance Gain," which application is hereby incorporated herein by reference.

BACKGROUND

Integrated circuits include interconnect structures, which may include metal lines and vias to serve as three-dimensional wiring structures. The function of the interconnect structures is to properly connect densely packed devices together.

The metal lines and vias are formed in the interconnect structure. The metal lines and vias are typically formed by damascene processes. A damascene process may include forming trenches and via openings in dielectric layers, depositing a barrier layer, followed by the filling of the trenches and via openings with copper. After a Chemical Mechanical Polish (CMP) process, the top surfaces of the metal lines are leveled, leaving the metal lines and vias in the trenches and the via openings, respectively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
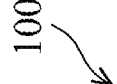
FIGS. 1-13 illustrate the cross-sectional views of intermediate stages in the formation of an interconnect structure in accordance with some embodiments.
Figure 1:
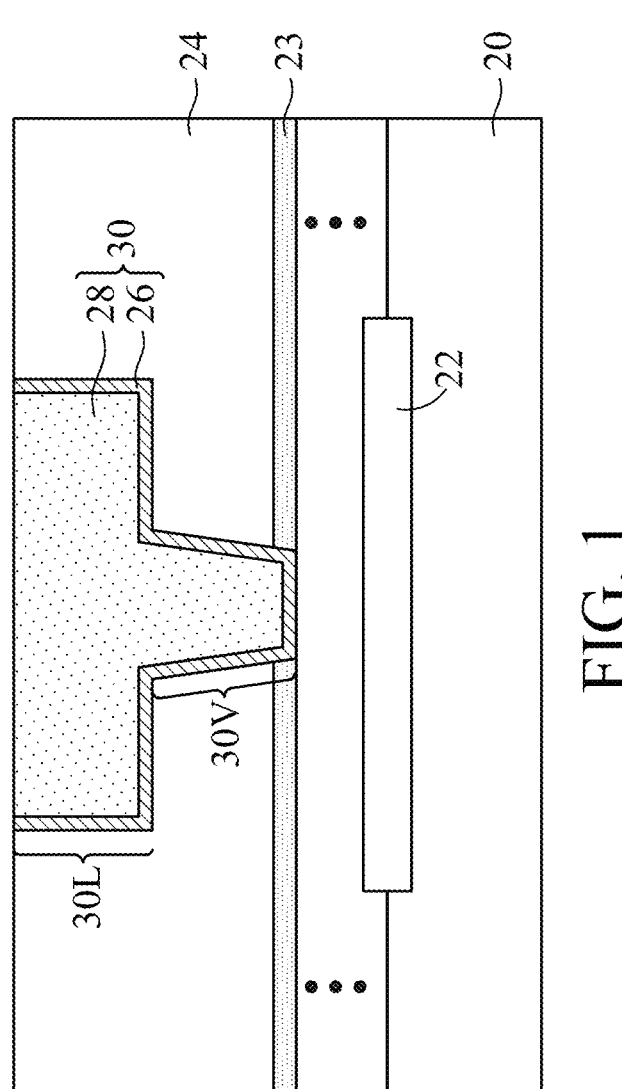

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of re-depositing a metal cap and selectively forming a conductive barrier for a conductive feature is provided in accordance with various embodiments. In accordance with some embodiments of the present disclosure, a trench and a via opening are formed in a dielectric layer, and a metal cap is exposed to the via opening. The metal cap may be undesirable removed in the formation of the via opening, and hence the underlying conductive feature may be exposed. The exposure of the copper causes electro migration and the difficulty in the formation of inhibitor, which is for selectively forming a conductive barrier in a subsequent process. In the present disclosure, after the formation of the via opening, an additional metal cap is selectively deposited on the conductive feature, followed by the formation of an inhibitor film on the additional metal cap, and the selective formation of a barrier layer. The inhibitor film prevents the barrier layer to be formed at the bottom of the via opening, and hence the increased resistance caused by the bottom portion of the barrier layer is eliminated. The inhibitor film is then removed. The remaining trench and opening is then filled with a metallic material to form a metal line and a via. The intermediate stages in the formation of the conductive feature are illustrated in accordance with some embodiments. Some variations of some embodiments are discussed. Throughout the various views and illustrative embodiments, like reference numbers are used to designate like elements.

Figure 15:
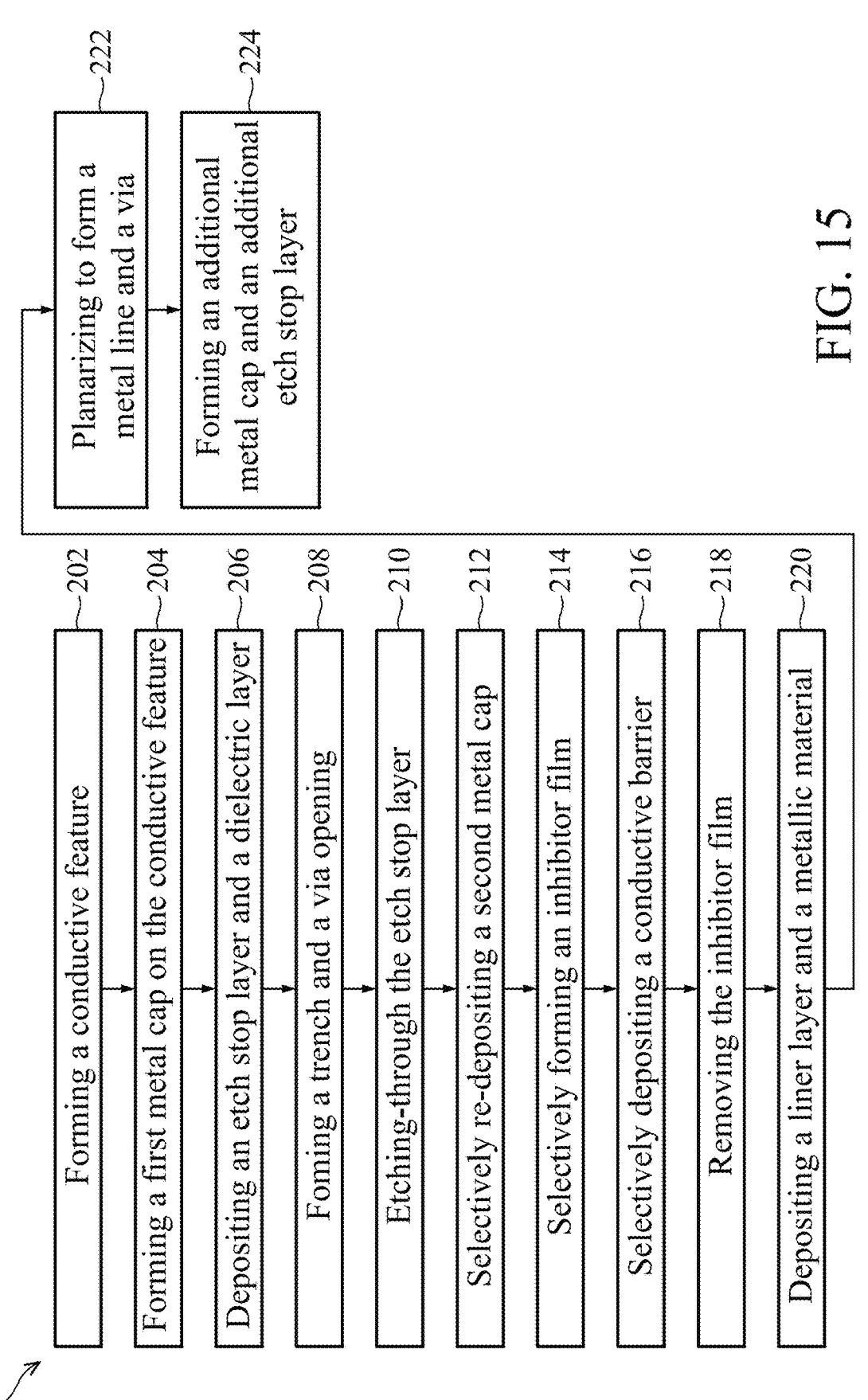
FIG. 15 illustrates a process flow for forming an interconnect structure in accordance with some embodiments.

FIGS. 1 through 13 illustrate the cross-sectional views of intermediate stages in the formation of a metal line and a via in accordance with some embodiments of the present disclosure. The corresponding processes are also reflected schematically in the process flow 200 as shown in FIG. 15.

FIG. 1 illustrates a cross-sectional view of package component 100. In accordance with some embodiments of the present disclosure, package component 100 is or comprises a device wafer (such as a logic device wafer), which includes active devices such as transistors and/or diodes, and may or may not include passive devices such as capacitors, inductors, resistors, or the like. In accordance with alternative embodiments of the present disclosure, package component 100 is an interposer wafer, which may not include active devices and/or passive devices. In accordance with yet alternative embodiments of the present disclosure, package component 100 is a package substrate strip, which may include package substrates with cores therein or core-less package substrates. In subsequent discussion, a device wafer is used as an example of the package component 100. The embodiments of the present disclosure may also be applied to other types of package components such as interposer wafers, package substrates, packages, etc.

In accordance with some embodiments of the present disclosure, package component 100 includes semiconductor substrate 20 and the features formed at a surface of semiconductor substrate 20. Semiconductor substrate 20 may comprise crystalline silicon, crystalline germanium, silicon germanium, a III-V compound semiconductor such as GaAsP, AlInAs, AlGaAs, GaInAs, GaInP, GaInAsP, or the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, wherein the through-vias are used to electrically inter-couple the features on opposite sides of semiconductor substrate 20.

In accordance with some embodiments of the present disclosure, package component 100 is used to form a device die. In accordance with these embodiments, integrated circuit devices 22 are formed on the top surface of semiconductor substrate 20. The examples of integrated circuit devices 22 include Complementary Metal-Oxide Semiconductor (CMOS) transistors, resistors, capacitors, diodes, or the like. The details of integrated circuit devices 22 are not illustrated herein. In accordance with alternative embodiments, package component 100 is used for forming interposers. In accordance with these embodiments, substrate 20 may also be a semiconductor substrate or a dielectric substrate.

Etch stop layer 23 and dielectric layer 24 are formed over substrate 20. Etch stop layer 23 may be formed of or comprise silicon oxide, silicon nitride, silicon carbo-nitride, silicon oxy-carbide, silicon oxy-nitride, silicon oxy-carbo-nitride, aluminum oxide, aluminum nitride, or the like, or combinations thereof. For example, etch stop layer 23 may include an aluminum nitride layer, a silicon oxy-carbide layer over the aluminum nitride layer, and an aluminum oxide layer over the silicon oxy-carbide layer.

Dielectric layer 24 may be an Inter-Layer Dielectric (ILD) or an Inter-Metal Dielectric (IMD). In accordance with some embodiments of the present disclosure, Dielectric layer 24 is an ILD, in which contact plugs are formed. The corresponding dielectric layer 24 may be formed of Phospho Silicate Glass (PSG), Boro Silicate Glass (BSG), Boron-Doped Phospho Silicate Glass (BPSG), Fluorine-Doped Silicate Glass (FSG), silicon oxide, or the like. Dielectric layer 24 may be formed using spin-on coating, Atomic Layer deposition (ALD), Flowable Chemical Vapor Deposition (FCVD), Chemical Vapor Deposition (CVD), Plasma-Enhanced Chemical Vapor Deposition (PECVD), Low-Pressure Chemical Vapor Deposition (LPCVD), or the like.

In accordance with alternative embodiments, dielectric layer 24 is an IMD, in which metal lines and/or vias are formed. The corresponding dielectric layer 24 may be formed of a carbon-containing low-k dielectric material, Hydrogen SilsesQuioxane (HSQ), MethylSilsesQuioxane (MSQ), or the like. In accordance with some embodiments of the present disclosure, the formation of dielectric layer 24 includes depositing a porogen-containing dielectric material, and then performing a curing process to drive out the porogen, and hence the remaining dielectric layer 24 is porous.

Conductive feature 30 is formed in dielectric layer 24. The respective process is illustrated as process 202 in the process flow 200 as shown in FIG. 15. Conductive feature 30 may be a metal line, a conductive via, a contact plug, or the like, or combinations thereof. For example, when dielectric layer 24 is an ILD, conductive feature may be a contact plug or a via. When dielectric layer 24 is an IMD, as shown in FIG. 1, conductive feature may be a via, or may include a metal line 30L and a via 30V underlying metal line 30L. Conductive feature 30 may include diffusion barrier layer 26 and metal region 28 over diffusion barrier layer 26. Diffusion barrier layer 26 may be formed of a conductive material such as titanium, titanium nitride, tantalum, tantalum nitride, cobalt, or the like. Metal region 28 may be formed of copper, a copper alloy, aluminum, tungsten, or the like. Diffusion barrier layer 26 has the function of preventing the material (such as copper) in conductive region 28 from diffusing into dielectric layer 24. There may be, or may not be, a conductive liner between diffusion barrier layer 26 and metal region 28. The conductive liner may be formed of cobalt or other conductive materials. In accordance with some embodiments of the present disclosure, the formation of conductive feature 30 may also adopt the processes as discussed subsequently, so that diffusion barrier layer 26 may not have a bottom horizontal portion.

Figure 2:
Figure 2:
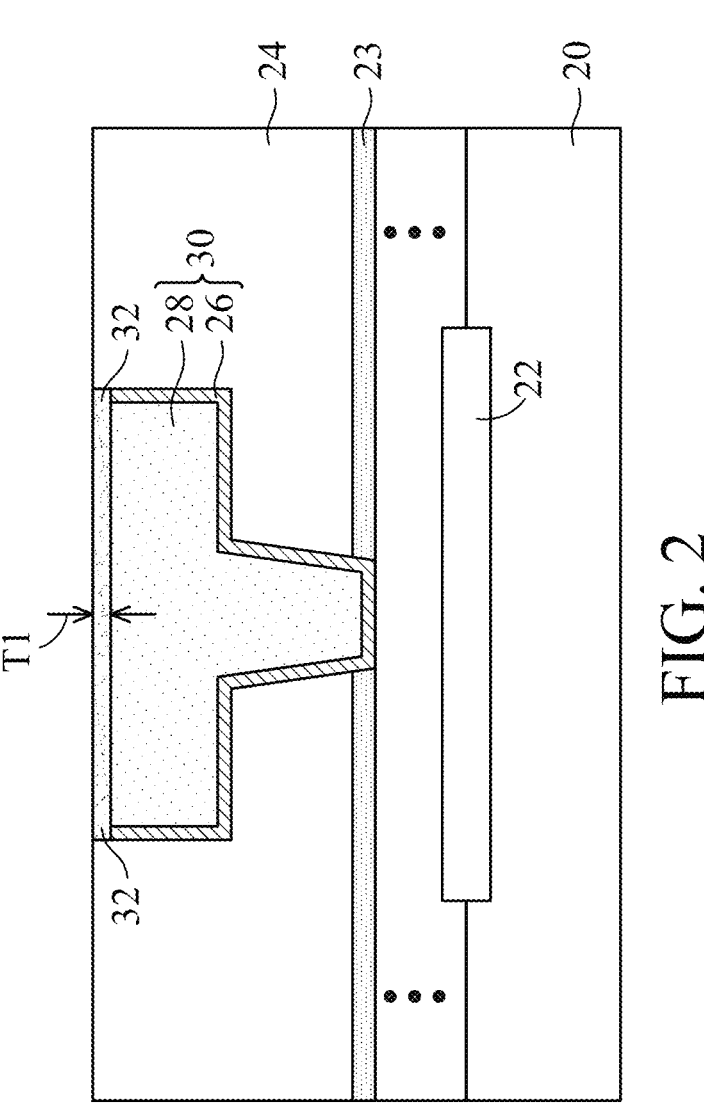

Referring to FIG. 2, in accordance with some embodiments of the present disclosure, metal cap 32 is formed over conductive feature 30. The respective process is illustrated as process 204 in the process flow 200 as shown in FIG. 15. In accordance with some embodiments, metal cap 32 is formed of or comprises cobalt (Co), CoWP, CoB, tungsten (W), tantalum (Ta), nickel (Ni), molybdenum (Mo), titanium (Ti), iron (Fe), or the like, or alloys thereof. Metal cap 32 may be formed selectively using CVD, which may be selective. Alternatively, metal cap 32 may be formed using Electro-Chemical Plating (ECP) or electroless plating, during which wafer 100 is submerged in a plating solution. In accordance with alternative embodiments of the present disclosure, metal cap 32 is blanket deposit on conductive feature 30 and dielectric layer 24, followed by an etching process to remove undesirable portions. Although FIG. 3 illustrates that metal cap 32 has a top surface level with the top surface of dielectric layer 24, the top surface of metal cap 32 may also be higher than the top surface of dielectric layer 24.

In accordance with some embodiments, metal cap 32, when formed of or comprising cobalt, may be deposited using a cobalt-comprising precursor and a reducing agent. The cobalt-comprising precursor may include a cobalt precursor gas selected from tricarbanyl allyl cobalt, cyclopentadienyl cobalt bis(carbonyl), methylcyclopentadienyl cobalt bis(carbonyl), ethylcyclopentadienyl cobalt bis(carbonyl), pentamethylcyclopentadienyl cobalt bis(carbonyl), dicobalt octa(carbonyl), nitrosyl cobalt tris(carbonyl), bis (cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis (methylcyclopentadienyl) cobalt, (cyclopentadienyl) cobalt (5-methylcyclopentadienyl), bis(ethylene) cobalt (pentamethylcyclopentadienyl), derivatives thereof, and/or combinations thereof. The reducing agent may include $H_2$, $NH_3$, or the like, or combinations thereof.

The thickness T1 of metal cap 32 may be in the range between about 10 Å and about 40 Å. In accordance with some embodiments, thickness T1 is in the range between about 10 Å and about 20 Å. In accordance with alternative embodiments, thickness T1 is in the range between about 20 Å and about 40 Å.

Figure 3:
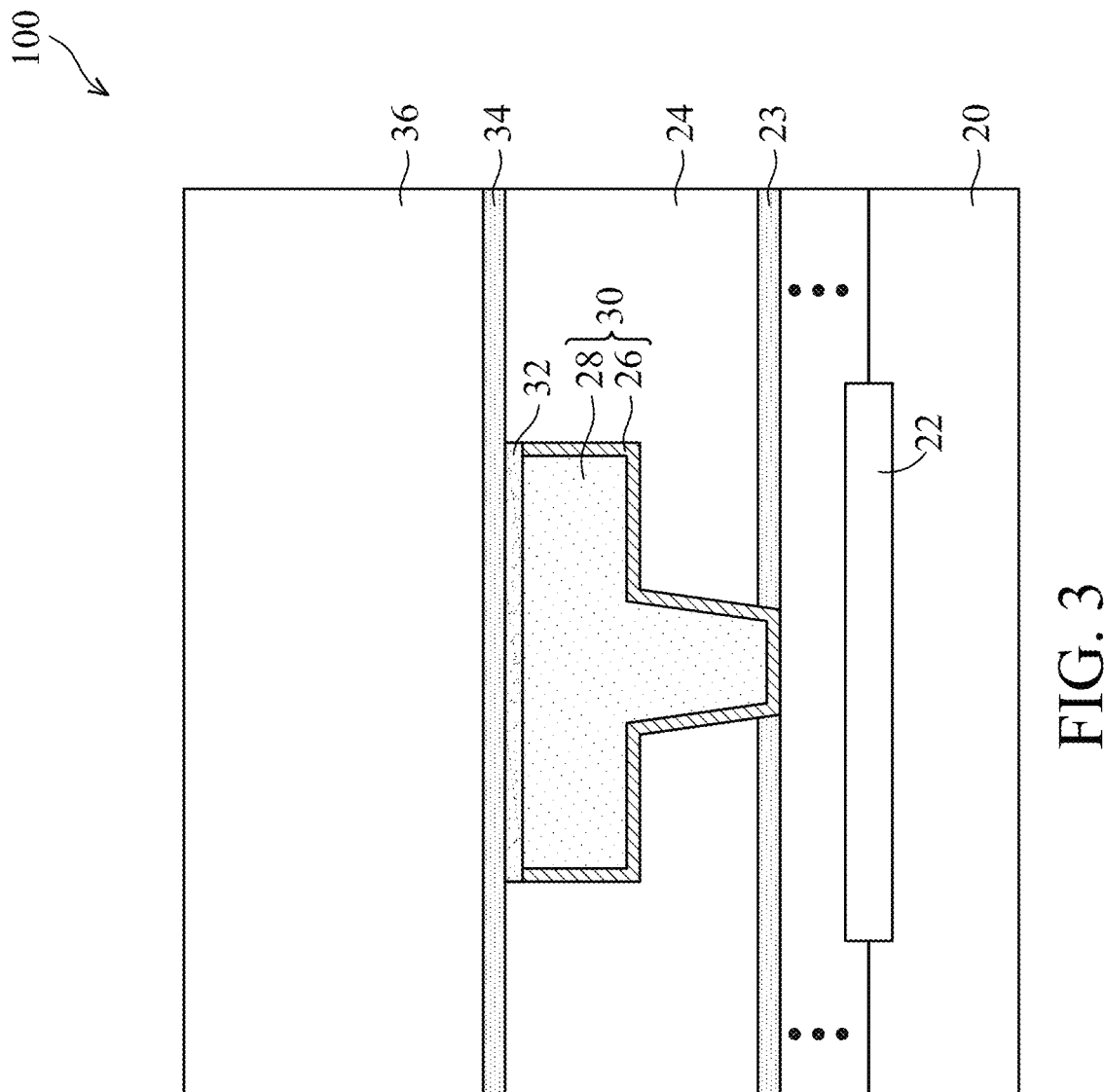

Referring to FIG. 3, etch stop layer 34 is formed over dielectric layer 24 and metal cap 32. The respective process is illustrated as process 206 in the process flow 200 as shown in FIG. 15. Etch stop layer 34 may include silicon nitride (SiN), silicon carbide (SiC), silicon oxy-nitride (SiON), silicon oxy-carbide (SiOC), silicon Carbo-nitride (SiCN), or the like. Etch stop layer 34 may also include a metal oxide, a metal nitride, or the like. Etch stop layer 34 may be a single layer formed of a homogeneous material, or a composite layer including a plurality of dielectric sub-layers formed of different materials. In accordance with some embodiments of the present disclosure, etch stop layer 34 includes an aluminum nitride (AlN) layer, a silicon oxy-carbide layer over the aluminum nitride layer, and an aluminum oxide layer over the silicon oxy-carbide layer.

Dielectric layer 36 is formed over etch stop layer 34. In accordance with some embodiments, dielectric layer 36 is an IMD or an ILD. Dielectric layer 36 may comprise a dielectric material such as an oxide, a nitride, a carbon-containing dielectric material, or the like. For example, dielectric layer 36 may be formed of or comprises a low-k dielectric material having a low dielectric constant value (k value) lower than about 3.5 or lower than about 3.0. Dielectric layer 36 may be formed of or comprise a carbon-containing low-k dielectric material, HSQ, MSQ, silicon oxide, phospho-silicate glass (PSG), borosilicate glass (BSG), boron-doped phospho-silicate glass (BPSG), fluorine-doped silicate glass (FSG), or the like. The deposition process may include Plasma Enhanced Chemical Vapor Deposition (PECVD), Low Pressure Chemical Vapor Deposition (LPCVD), or the like.

FIGS. 4 through 12 illustrate the process for forming a metal line and a via in accordance with some embodiments. It is appreciated that the examples as shown in FIGS. 4 through 12 recite a dual damascene process. In accordance with alternative embodiments, a single damascene process, in which a metal line, a via, a contact plug, or the like, may be formed, and the formation process is also contemplated.

Figure 4:
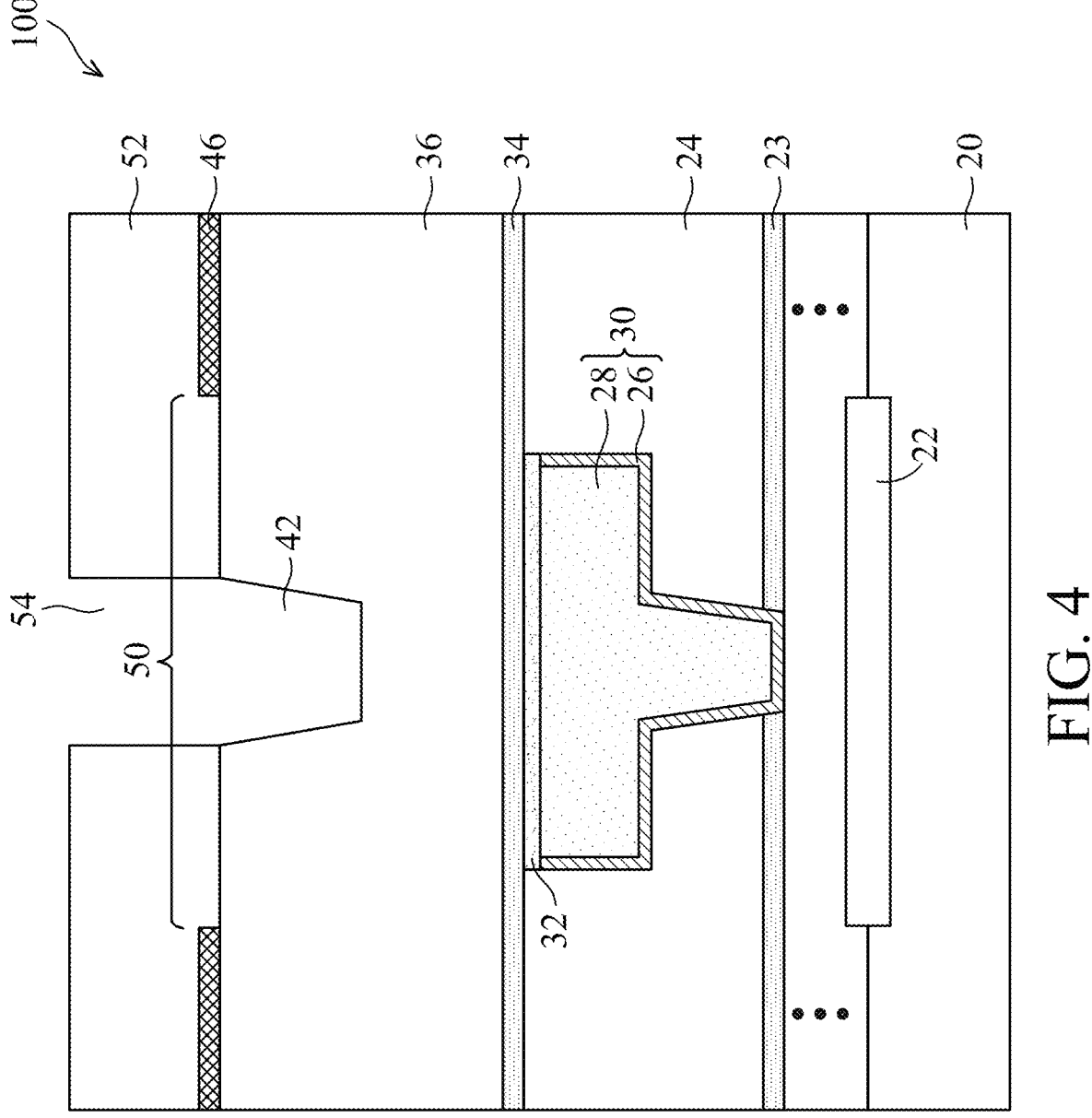
Figure 5:
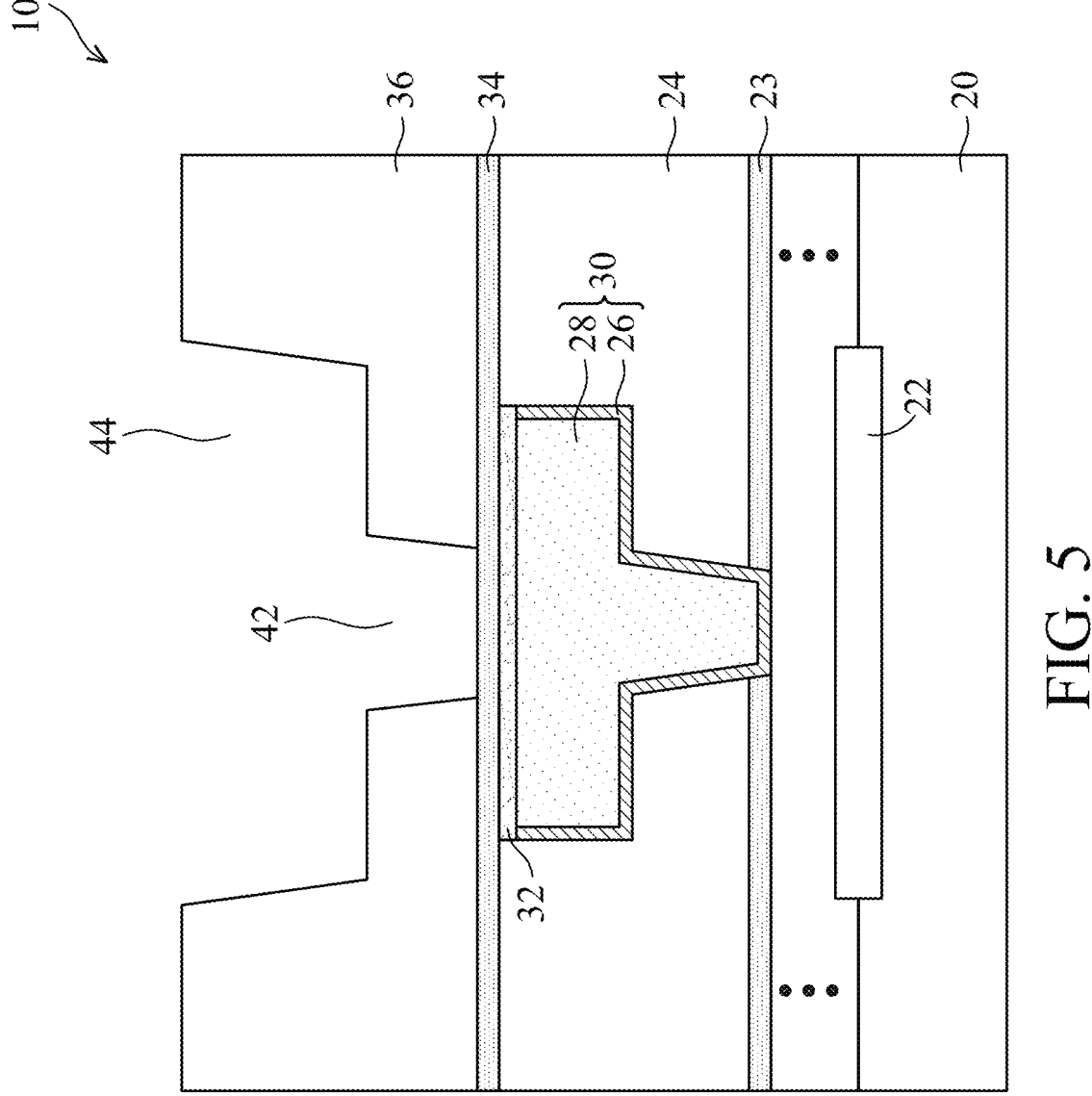

As shown in FIGS. 4 and 5, via opening 42 and trench 44 are formed through etching. The respective process is illustrated as process 208 in the process flow 200 as shown in FIG. 15. Via opening 42 and trench 44 may be formed using, for example, photolithography techniques. In an example formation process, as shown in FIG. 4, hard mask 46 is first formed and patterned to have the pattern of the trench 44. Hard mask may 46 be formed of titanium nitride, boron nitride, or the like. Hard mask 46 is patterned to form opening 50, wherein the opening 50 defines the pattern of the trench that is to be filled for forming a metal line. Next, photo resist 52 is formed on hard mask 46, and is then patterned to form opening 54, through which dielectric layer 36 is exposed. Dielectric layer 36 is then etched to form via opening 42. In accordance with some embodiments of the present disclosure, the etching of dielectric layer 36 is performed using a process gas comprising fluorine and carbon, wherein fluorine is used for etching, with carbon having the effect of protecting the sidewalls of the resulting opening. With an appropriate fluorine and carbon ratio, via opening 42 may have a desirable profile. For example, the process gases for the etching may include a fluorine and carbon-containing gas(es) such as $C_4F_8$, $CH_2F_2$, and/or $CF_4$, and a carrier gas such as $N_2$.

The etching for forming via opening 42 may be performed using a time-mode. As a result of the etching, via opening 42 extends to an intermediate level between the top surface and the bottom surface of dielectric layer 36. Next, photo resist 52 is removed, followed by the further etching of dielectric layer 36 using hard mask 46 as an etching mask. In the etching process, which is an anisotropic etching process, via opening 42 extends down until etch stop layer 34 is exposed. At the same time via opening 42 is extended downwardly, trench 44 is formed to extend into dielectric layer 36, and the resulting structure is illustrated in FIG. 5.

In accordance with alternative embodiments, via opening 42 and trench 44 are formed in separate photo lithography processes. For example, in a first photo lithography process, trench 44 is formed. In a second lithography process, via opening 42 is formed extending down to etch stop layer 34. The order for forming via opening 42 and trench 44 may also be inversed.

Figure 6:
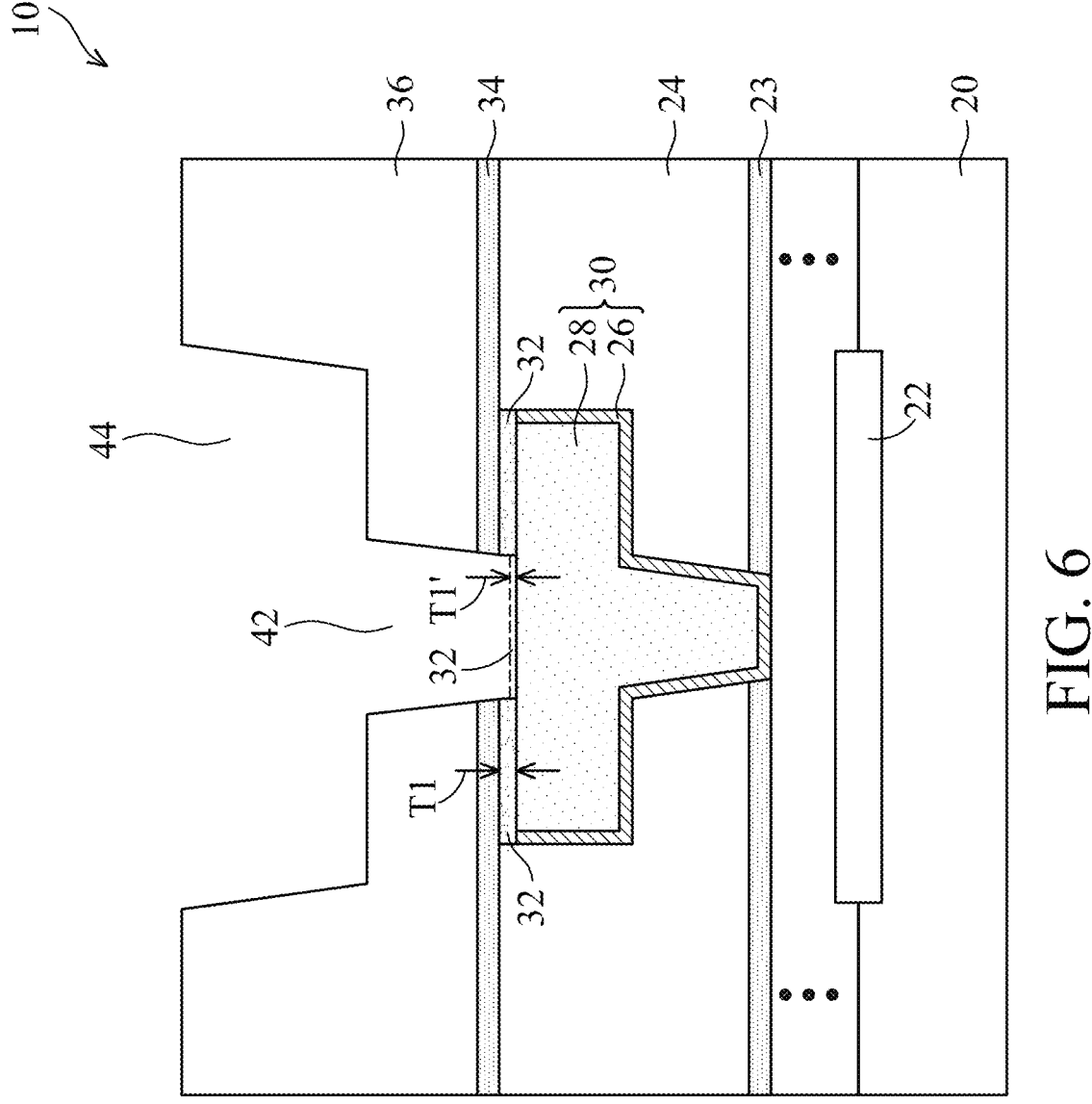

Next, as also shown in FIG. 6, etch stop layer 34 is etched-through. The respective process is illustrated as process 210 in the process flow 200 as shown in FIG. 15. In accordance with some embodiments of the present disclosure, a wet etching process is adopted. The etching solution may include glycol, dimethyl sulfide, amine, $H_2O_2$, and the like. Glycol may be used as a surfactant. Dimethyl sulfide may be used as a solvent. Amine may be used for removing undesirable organic substance on the surface of package component 100, and $H_2O_2$ and amine may be used for etching etch stop layer 34. The cleaning process may also be performed using a diluted HF solution when wet cleaning is used. Also, an additional wet clean process may (or may not) be performed after etch stop layer 34 is etched-through. The additional clean process may be performed to remove the byproduct and any oxide in trench 44 and via opening 42. In accordance with some embodiments, the additional cleaning process may be performed through a dry etching process. The etching gases may include the mixture of $NF_3$ and $NH_3$, the mixture of HF and $NH_3$, or the like.

The etching of etch stop layer 34 and the additional cleaning process (if any) may cause the removal or the thinning of the exposed portion of metal cap 32. In accordance with some embodiments, as shown in FIG. 6, the exposed portion of metal cap 32 directly underlying via opening 42 is etched-through, The exposed portion of metal cap 32 may be fully or partially removed. The underlying metal region 28 (which may comprise copper) is exposed. In accordance with alternative embodiments, the exposed portion of metal cap 32 directly underlying via opening 42 is thinned, but not etched-through. For example, FIG. 6 illustrates an example remaining portion of metal cap 32, which is shown using a dashed line to indicate that this portion of metal cap 32 may or may not exist. The thinned portion of metal cap 32 may still fully cover conductive feature 28. In accordance with some embodiments, some exposed portions of metal cap 32 are etched-through to reveal the underlying metal region 28, while some other exposed portions of metal cap 32 are thinned, but not fully removed. The thickness T1' of the thinned metal cap 32 may be in the range between about 10 percent and about 70 percent of thickness T1. In accordance with these embodiments, some portions of the remaining portions of metal cap 32 may be discontinuous, and may possibly form discrete islands, which are separated from each other, with the metal region 28 exposed through the openings between the islands. Alternatively, a portion of the thinned metal cap 32 may have an opening therein to expose the underlying conductive feature 28. The example discrete islands of metal cap 32 are shown schematically in FIGS. 13 and 14.

Figure 8:
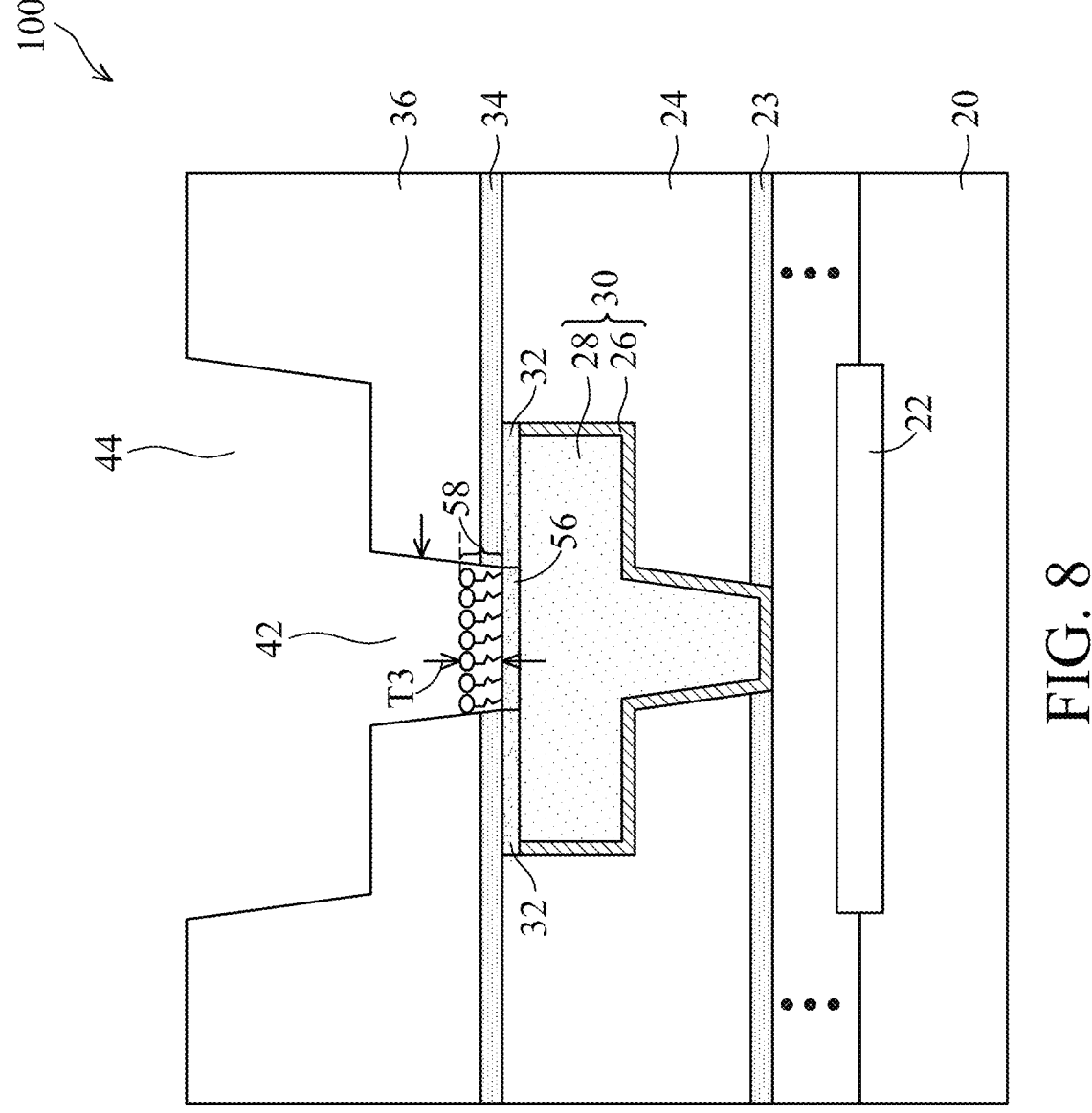

The adverse etching-through or thinning of metal cap 32 has some undesirable effects. For example, in the process as shown in FIG. 8, inhibitor film 58 will be formed at the bottom of via opening 42. The inhibitor film 58 is thermally unstable on some metals such as copper. If metal region 28 (which may comprise copper) is exposed, the inhibitor film 58 may not be formed on the surface of metal region 28, or the inhibitor film 58 may not be a continuous film. This will sacrifice the selectivity in the subsequent formation of conductive barrier 60 (FIG. 9), and the conductive barrier 60 may be undesirably formed on the top of metal region 28. In addition, metal cap 32 has the function of preventing electro migration of copper, and hence if removed or thinned, electro migration may occur between metal region 28 and via 68 (FIG. 13), and void may occur in either via 68 or metal region 28 due to the electro migration.

Figure 7:
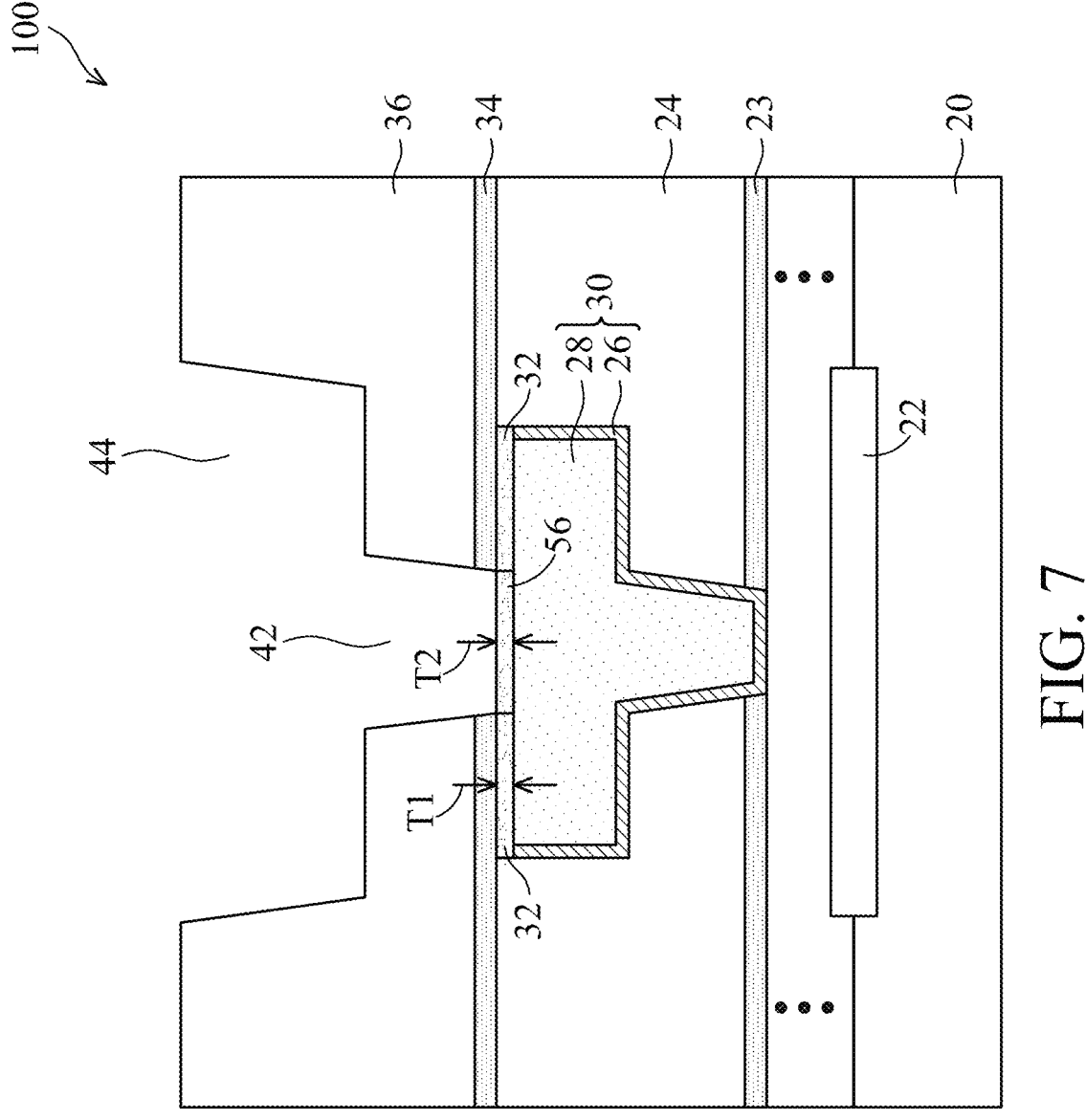

In accordance with some embodiments, as shown in FIG. 7, to replenish the lost portion of metal cap 32, a selective re-deposition process is performed to form metal cap 56. The respective process is illustrated as process 212 in the process flow 200 as shown in FIG. 15. With the selective re-deposition, metal cap 56 is deposited at the bottom of via opening 42, and is not deposited on the sidewalls and top surfaces of dielectric layer 36 and etch stop layer 34. In accordance with some embodiments in which the entire portion of metal cap 32 directly underlying via opening 42 is removed, as shown in FIG. 7, metal cap 56 has its entire bottom surface in contact with the top surface of the exposed portion of metal region 28. In accordance with alternative embodiments in which metal cap 32 is thinned and is not etched-through, metal cap 56 has its entire bottom surface in contact with the top surface of the thinned metal cap 32. In accordance with yet alternative embodiments in which metal cap 32 has some portions etched-through and some other portions not etched through, the bottom surface of metal cap 56 has some portions in contact with the top surface of the thinned metal cap 32, and some other portions in contact with the top surface of metal region 28.

In accordance with some embodiments, metal cap 56 may be formed of or comprises cobalt (Co), CoWP, CoB, tungsten (W), tantalum (Ta), nickel (Ni), molybdenum (Mo), titanium (Ti), iron (Fe), or the like, or alloys thereof. The materials of metal cap 32 and metal cap 56, while may be selected from similar or the same group of candidate materials, may be same as each other or different from each other. For example, one of metal cap 32 and 56 may include cobalt, while the other may include a material that does not include copper. Alternatively, both of metal cap 32 and metal cap 56 may comprise the same material such as cobalt, but metal cap 32 and metal cap 56 may include different percentages of the material (for example, cobalt) and/or different other materials.

In accordance with some embodiments in which metal cap 56 is formed of or comprises cobalt, the selective re-deposition process of metal cap 56 is performed using a cobalt-comprising precursor and a reducing agent. The cobalt-comprising precursor may include a cobalt precursor gas selected from tricarbanyl allyl cobalt, cyclopentadienyl cobalt bis(carbonyl), methylcyclopentadienyl cobalt bis(carbonyl), ethylcyclopentadienyl cobalt bis(carbonyl), pentamethylcyclopentadienyl cobalt bis(carbonyl), dicobalt octa (carbonyl), nitrosyl cobalt tris(carbonyl), bis (cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), derivatives thereof, and/or combinations thereof. The reducing agent may include $H_2$, $NH_3$, or the like, or combinations thereof. The deposition process may include a CVD process, an ALD process, or the like. In accordance with some embodiments, the re-deposition process may last for a period of time in the range between about 10 seconds and about 200 seconds. The temperature of package component 100 during the re-deposition may be in the range between about 180° C. and about 400° C.

The process conditions of the re-deposition process are controlled to achieve selective deposition of metal cap 56 on metal cap 56, and not on the exposed surfaces of dielectric layer 36 (and etch stop layer 34, if exposed). In accordance with some embodiments, the flow rate FR-RA of the reducing agent is selected to be greater than the flow rate FR-Co of the cobalt-comprising precursor. The ratio FR-RA/FA-Co is greater than 1.0, and may be greater than 10, greater than about 100, or greater than about 400. For example, the ratio FR-RA/FA-Co may be in the range between about 400 and about 600. The flow rate of the reducing agent such as hydrogen may be in a range between about 5,000 sccm and about 10,000 sccm, while the flow rate of the cobalt-comprising precursor may be in the range between about 10 sccm and about 30 sccm. When the CVD is used, the reducing agent and the cobalt-comprising precursor are conducted simultaneously into a corresponding process chamber. When the ALD is used, the reducing agent and the cobalt-comprising precursor are separately conducted into, and purged from, the corresponding process chamber.

With the properly selected process conditions such as the flow rate ratio and the temperature as discussed above, selective re-deposition is achieved, and metal cap 56 is deposited on the top surface of conductive feature 30. If there are remaining portions of metal cap 32 directly underlying via opening 42, the metal cap 56 is also deposited on, and contacting, the top surface of the remaining metal cap 32. The exposed surfaces of dielectric features such as dielectric layer 36 and etch stop layer 34, on the other hand, has no metal cap 56 formed thereon.

The thickness T2 of metal cap 56 may be in the range between about 10 Å and about 40 Å. In accordance with some embodiments, thickness T2 is in the range between about 10 Å and about 20 Å. In accordance with alternative embodiments, thickness T2 is in the range between about 20 Å and about 40 Å. Furthermore, thickness T2 may be equal to, smaller than, or greater than, the thickness T1 of metal cap 32. It is realized that since the formation of metal cap 56 is performed after the formation of via opening 42 and trench 44, there will be no more loss of metal cap 56, and hence metal cap 56 may be formed thinner than metal cap 32 without the concern of electro migration. As discussed above, metal cap 32 may have some thinned portions directly underlying and contacting metal cap 56.

Metal cap 32 and metal cap 56 are formed in different processes. Furthermore, metal cap 32 and metal cap 56 may have different (or the same) materials, formed under different process conditions, and/or may have the same or different percentages of elements therein. Accordingly, metal cap 32 and metal cap 56 may be distinguishable from each other, and may have distinguishable interfaces, regardless of whether they are formed of the same or different materials, and regardless of whether they have the same or different percentage of elements. Furthermore, metal cap 32 and metal cap 56 may have different lattice structures. For example, one of metal cap 32 and metal cap 56 may be amorphous, while the other may be polycrystalline. Alternatively, both of metal cap 32 and metal cap 56 may have polycrystalline structures, but have different grain sizes and/or grain directions, so that they can be distinguished from each other.

Referring to FIG. 8, inhibitor film 58 is deposited. The respective process is illustrated as process 214 in the process flow 200 as shown in FIG. 15. Inhibitor film 58 is selective to metal and dielectric. Accordingly, the deposition is also selective, so that inhibitor film 58 is formed on metal cap 56, and not on the exposed surfaces of dielectric layers such as dielectric layer 36 and etch stop layer 34. In accordance with some embodiments, inhibitor film 58 is formed through a dry formation process, in which an inhibitor-comprising process gas is conducted into a process chamber, with the package component 100 placed therein. Accordingly, package component 100 is soaked in the inhibitor-comprising process gas. The inhibitor-comprising process gas may include a carbon-and-hydrogen containing gas such as acetylene ($C_2H_2$), organosilane (C8~C20, ex: dodecylsilane), organophosphoric acid (C8~C20, for example, octadecylphosphonic acid), an organic polymer (polyimide:pyromellitic dianhyd such as ride+1,6-diaminohexane, polyamide:ethylene diamine or adipoyl chloride), or the like, or combinations thereof. The inhibitor-comprising process gas may also include a long-carbon-chain precursor which may also be mixed with the carbon-and-hydrogen containing gas. The soaking pressure in the process chamber may be in the range between about 1 Torr and about 10 Torr. The soaking time may be in the range between about 30 seconds and about 30 minutes. The temperature of package component 100 in the soaking may be in the range between about 40° C. and about 300° C.

In accordance with alternative embodiments, inhibitor film 58 is formed through a wet formation process, in which an inhibitor-comprising precursor is dissolved into a solvent to form a chemical solution, and the resulting solvent is used to submerge the package component 100 therein, or spayed onto package component 100. The inhibitor-comprising process precursor may include a carbon-and-hydrogen containing chemical such as acetylene ($C_2H_2$), or the like. The inhibitor-comprising process precursor may also include a long-carbon-chain precursor which may also be mixed with the carbon-and-hydrogen containing precursor.

In accordance with some embodiments, the formed inhibitor film 58 may be a mono-layer film or may include a plurality of mono-layers. The thickness T3 of inhibitor film 58 may be in the range between about 2 Å and about 15 Å. It is appreciated that the thickness T3 may be exaggerated in FIG. 8, and the actual thickness may be much smaller. Inhibitor film 58 may comprise elements such as carbon, hydrogen. Also, inhibitor film 58 may include the elements from acetylene ($C_2H_2$), organosilane (C8~C20, ex:dodecylsilane), organophosphoric acid (C8~C20, for example, octadecylphosphonic acid), an organic polymer (polyimide:pyromellitic dianhyd such as ride+1,6-diaminohexane, polyamide:ethylene diamine or adipoyl chloride), and the elements include carbon and hydrogen.

It is desired that inhibitor film 58 has a good coverage, for example, 100 percent, or at least 90 percent or greater, of the top surface of metal cap 56, so that no (or at least little) surface of metal cap 56 is exposed after the formation of inhibitor film 58. The increase in the coverage may be achieved by prolonging the reaction time.

Figure 9:
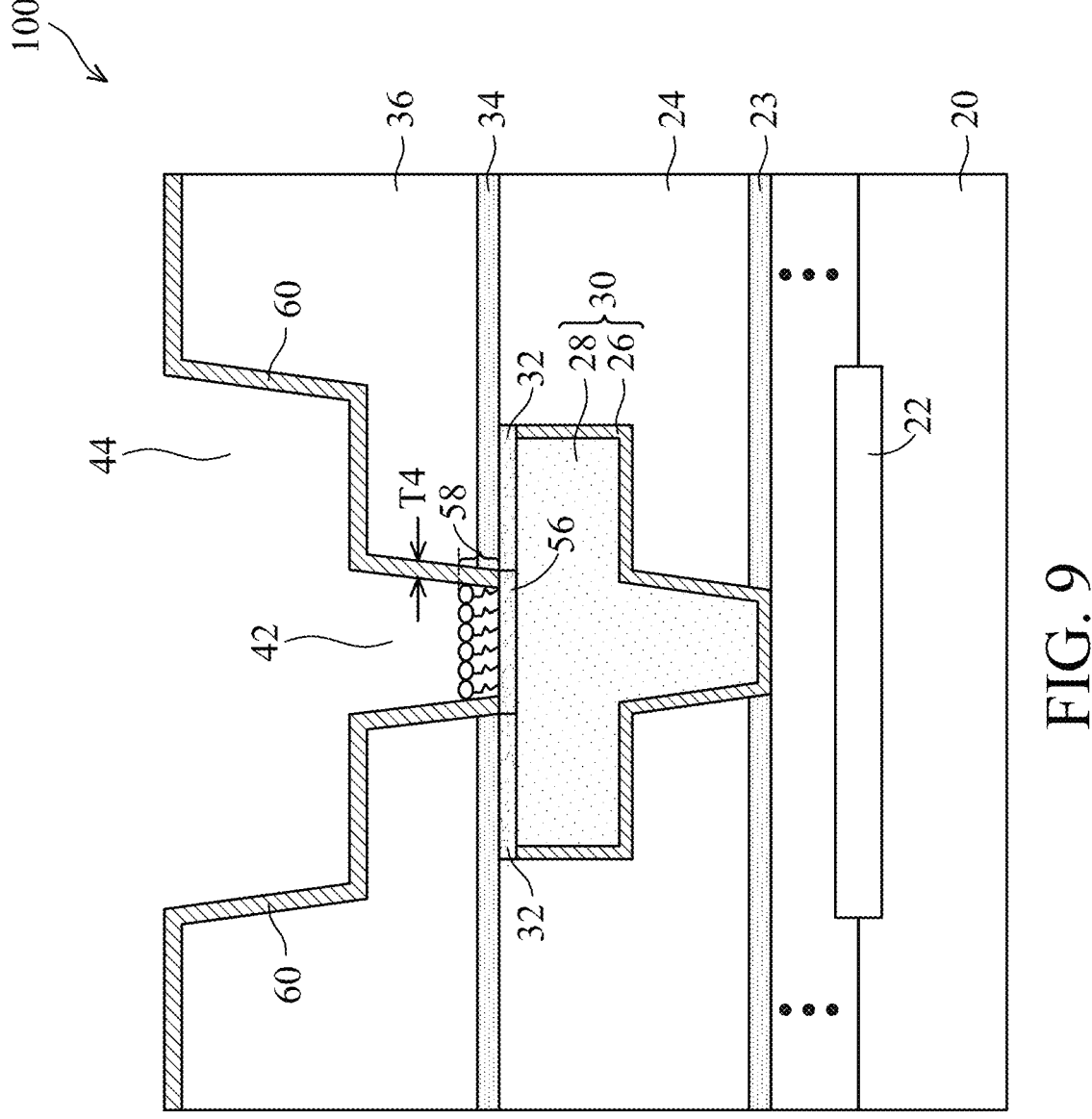

Next, referring to FIG. 9, conductive barrier 60 is deposited lining via opening 42 and trench 44. The deposition process may be achieved, for example, using an ALD process or a CVD process. The respective process is illustrated as process 216 in the process flow 200 as shown in FIG. 15. Conductive barrier 60 may include tantalum, tantalum nitride, titanium, titanium nitride, ruthenium, or the like, and has the function of preventing copper in the subsequently deposited copper-containing region 66 (FIG. 11) from diffusing into dielectric layer 36. In accordance with some embodiments, conductive barrier 60 may be deposited using Physical Vapor Deposition (PVD), wherein a target of a corresponding metal such as Ta, Ti, Ru, etc., is used. In accordance with alternative embodiments in which TaN is formed, a Ta-containing and nitrogen-containing process gas such as Pentakis Dimethylamino Tantalum ($C_{10}H_{30}N_5Ta$), $TaCl_5$, or the like and a reducing agent such as $H_2$ may be used, wherein CVD or another applicable process may be used. In accordance with some embodiments of the present disclosure, conductive barrier 60 comprises TaN formed using ALD. The corresponding ALD cycle may include conducting a Ta-containing process gas such as Pentakis Dimethylamino Tantalum ($C_{10}H_{30}N_5Ta$), $TaCl_5$, or the like into the respective ALD chamber, purging the Ta-containing process gas, conducting a nitrogen-containing process gas such as ammonia into the process chamber, and purging the nitrogen-containing process gas. There may be a plurality of ALD cycles. After the formation of conductive barrier 60, thickness T4 of the portion of conductive barrier 60 on the sidewalls of dielectric layer 36 is great enough to act as a diffusion barrier. Thickness T4 may be greater than about 10 Å, for example, in the range between about 10 Å and about 40 Å.

Due to the existence of inhibitor film 58, the conductive barrier 60 is deposited where inhibitor film 58 does not exist such as the sidewalls of dielectric layer 36 and etch stop layer 34 (when exposed). The increased resistance caused by the bottom portion of conductive barrier 60 is thus eliminated, especially when conductive barrier 60 is formed of a high-resistivity material such as a metal nitride. Inhibitor film 58 is also formed on the top surfaces of dielectric layer 36. Conductive barrier 60 is not deposited on metal cap 56. Conductive barrier 60 may be a conformal layer except where inhibitor film 58 is formed.

Figure 10:
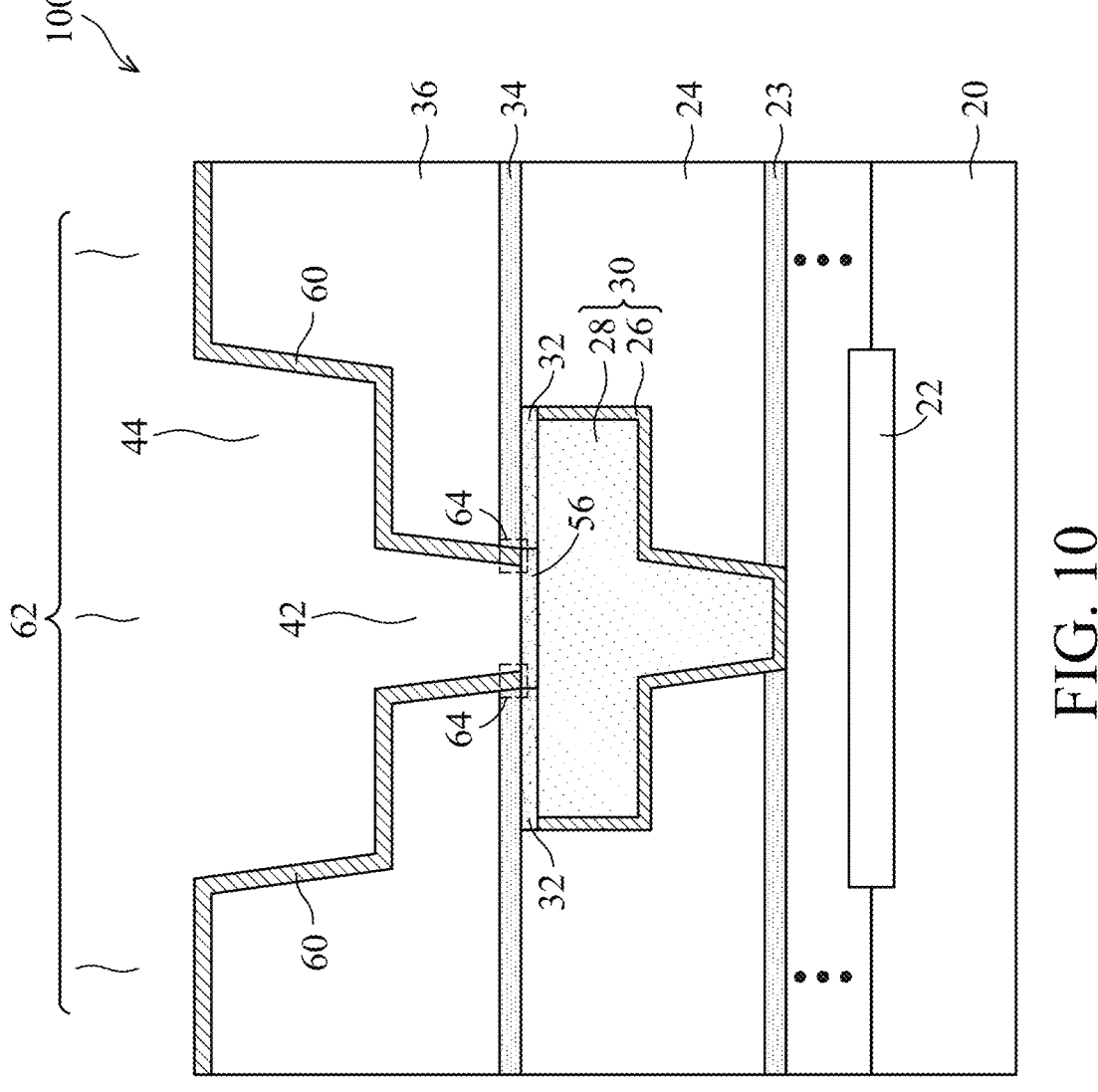

Referring to FIG. 10, a post-deposition treatment process 62 is performed to remove inhibitor film 58. The respective process is illustrated as process 218 in the process flow 200 as shown in FIG. 15. The post-deposition treatment process 62 may be performed through a plasma treatment process and/or a thermal treatment process. The process gas may include oxygen ($O_2$). In accordance with some embodiments of the present disclosure, a plasma treatment is performed. The treatment duration may be in the range between about 10 seconds and about 60 seconds. In accordance with alternative embodiments of the present disclosure, a thermal treatment is performed (with no plasma being generated). During the thermal treatment, the temperature of package component 100 may be higher than about 150° C., for example, in the range between about 150° C. and about 350° C. The treatment duration may be in the range between about 10 seconds and about 300 seconds. In accordance with alternative embodiments, the removal of inhibitor film 58 may be performed through a baking process, wherein no oxygen-containing process is conducted. The duration of the baking process may be in the range between about 0.5 minutes and about 5 minutes. The temperature of package component 100 in the baking process may be in the range between about 150° C. and about 350° C.

As a result of the post-deposition treatment process 62, inhibitor film 58 is removed. The resulting structure is shown in FIG. 10. In the post-deposition treatment, inhibitor film 58 is decomposed into gases, which are removed. In addition, the oxide of metal cap 56, if any, may be reduced back to elemental metal through the introduction of hydrogen ($H_2$) in an additional treatment process, which may be performed after the treatment using oxygen (if performed). After the removal of inhibitor film 58, the bottom ends of conductive barrier 60 may be in contact with the top surface of metal cap 56, and may be in contact with the sidewall of the metal cap 32 if metal cap 56 is thinner than metal cap 32. Alternatively, due to the removal of inhibitor film 58, the bottom ends of conductive barrier 60 are higher than, and are spaced apart from, the top surface of metal cap 56. For example, dashed boxes 64 are drawn in FIG. 10, and the portions of conductive barrier 60 inside dashed boxes 64 may or may not exist.

An advantageous feature of performing the post-deposition treatment after the deposition of conductive barrier 60 is that conductive barrier 60 is condensed by the post-deposition treatment. By increasing the density of conductive barrier 60, its ability of blocking the diffusion of materials (such as copper) through conductive barrier 60 is improved.

Figure 11:
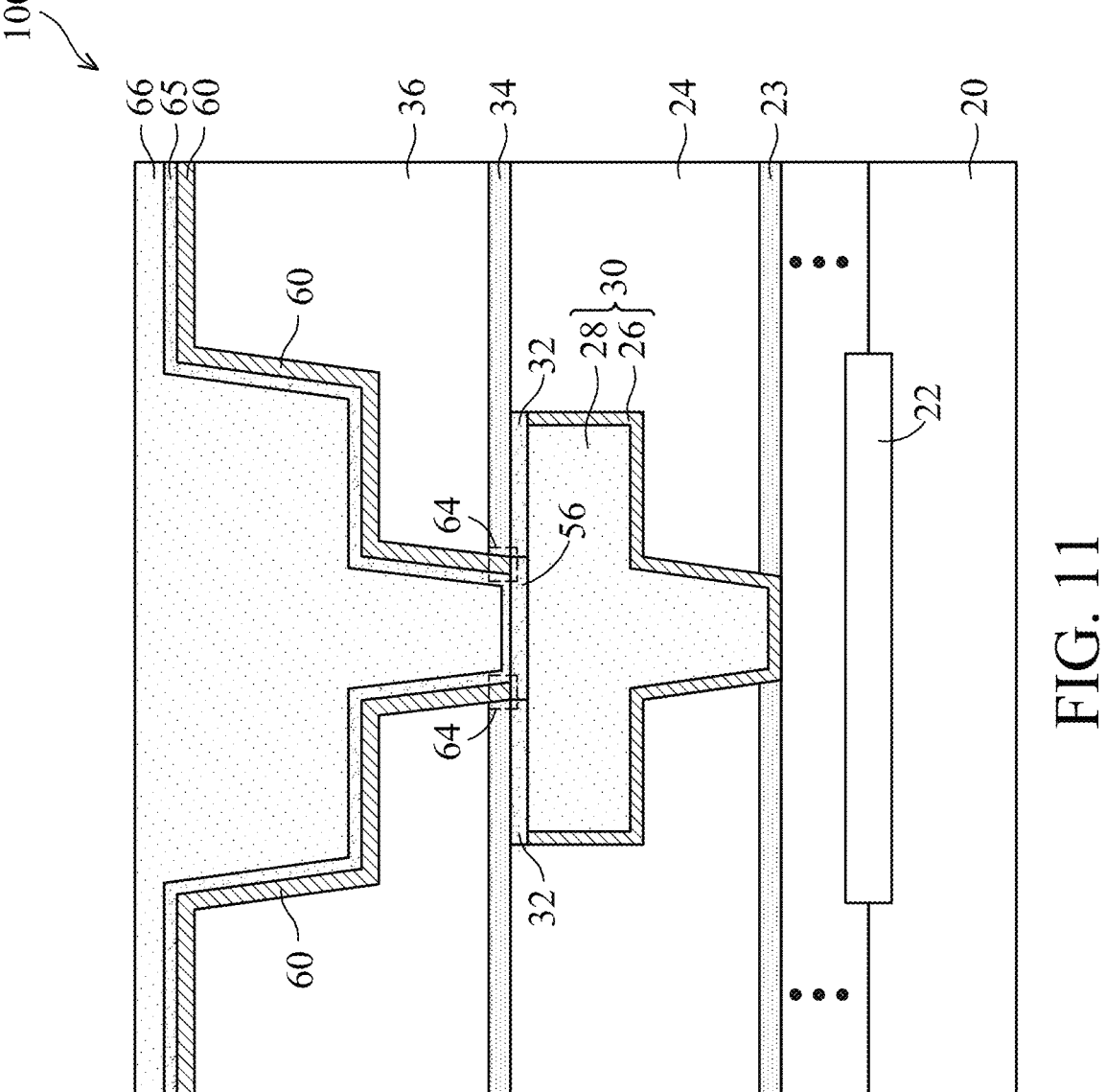

Referring to FIG. 11, conductive materials are deposited to fill via opening 42 and trench 44. In accordance with some embodiments, the deposition of the conductive materials includes performing a deposition process to form liner layer 65, and then filling the rest of via opening 42 and trench 44 with metallic material 66. The respective process is illustrated as process 220 in the process flow 200 as shown in FIG. 15. Liner layer 65 may be formed of or comprise a metal such as cobalt. The formation of liner layer 65 may include PVD, CVD, or the like. The metallic material 66 may comprise copper, tungsten, or the like, and may be formed through electro-plating, electro-less plating, deposition, or the like.

Figure 12:
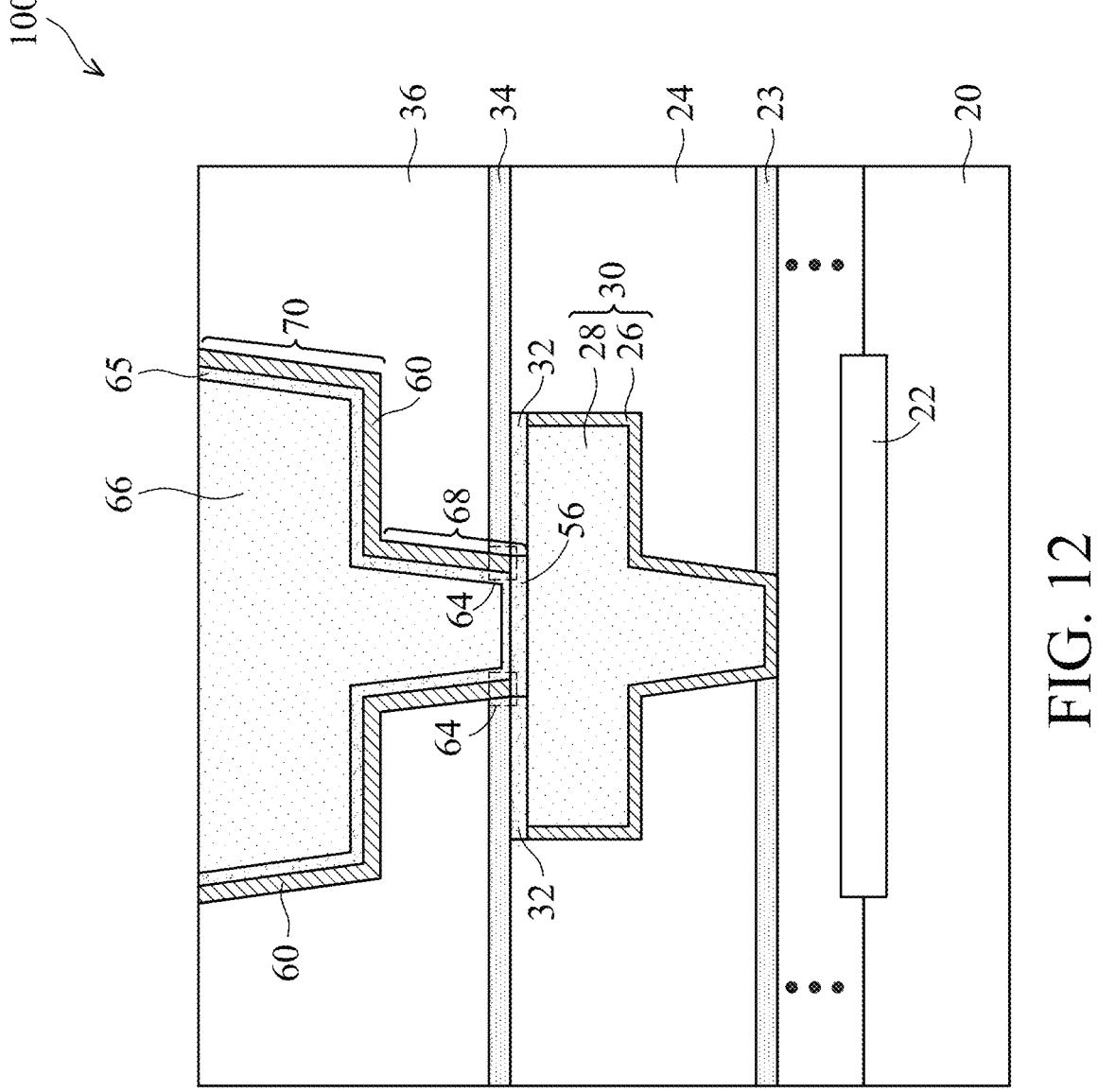

Referring to FIG. 12, a planarization process such as a Chemical Mechanical Planarization (CMP) process or a mechanical polish process is performed to remove excess portions of liner layer 65 and metallic material 66, hence forming via 68 and metal line 70. The respective process is illustrated as process 222 in the process flow 200 as shown in FIG. 15. Each of via 68 and metal line 70 includes a portion of conductive barrier 60, a portion of liner layer 65, and a portion of metallic material 66. Conductive barrier 60 forms a ring fully encircle liner layer 65 and metallic material 66.

Due to the selective formation of conductive barrier 60, via 68 and metal cap 56 do not have conductive barrier 60 in between. Accordingly, the resistance between conductive feature 30 and via 68 is small. Furthermore, the re-deposition of metal cap 56 improves the resistance to the electro migration that may occur between conductive feature 30 and via 68.

Figure 13:
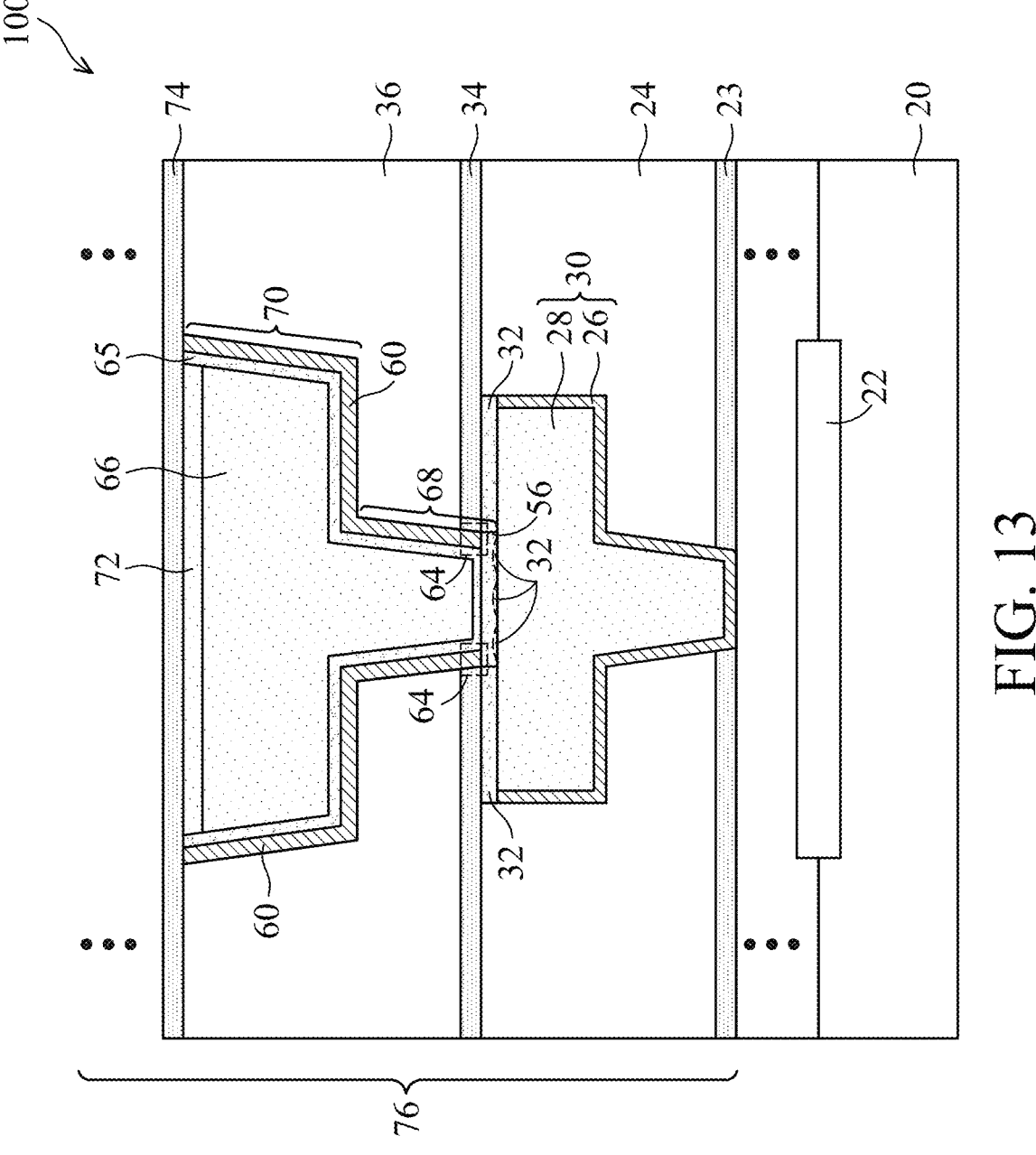

FIG. 13 illustrates the formation of metal cap 72 and etch stop layer 74, which may have a structure and a material selected from the same candidate group of structures and materials for forming metal cap 32 and etch stop layers 23 and 34, respectively. The respective process is illustrated as process 224 in the process flow 200 as shown in FIG. 15. In subsequent processes, more upper layers of the interconnect structure 76 are formed. The formation process, the structure, the material of the upper layers of the interconnect structure may be essentially the same as shown and discussed referring to FIGS. 2 through 12.

Figure 14:
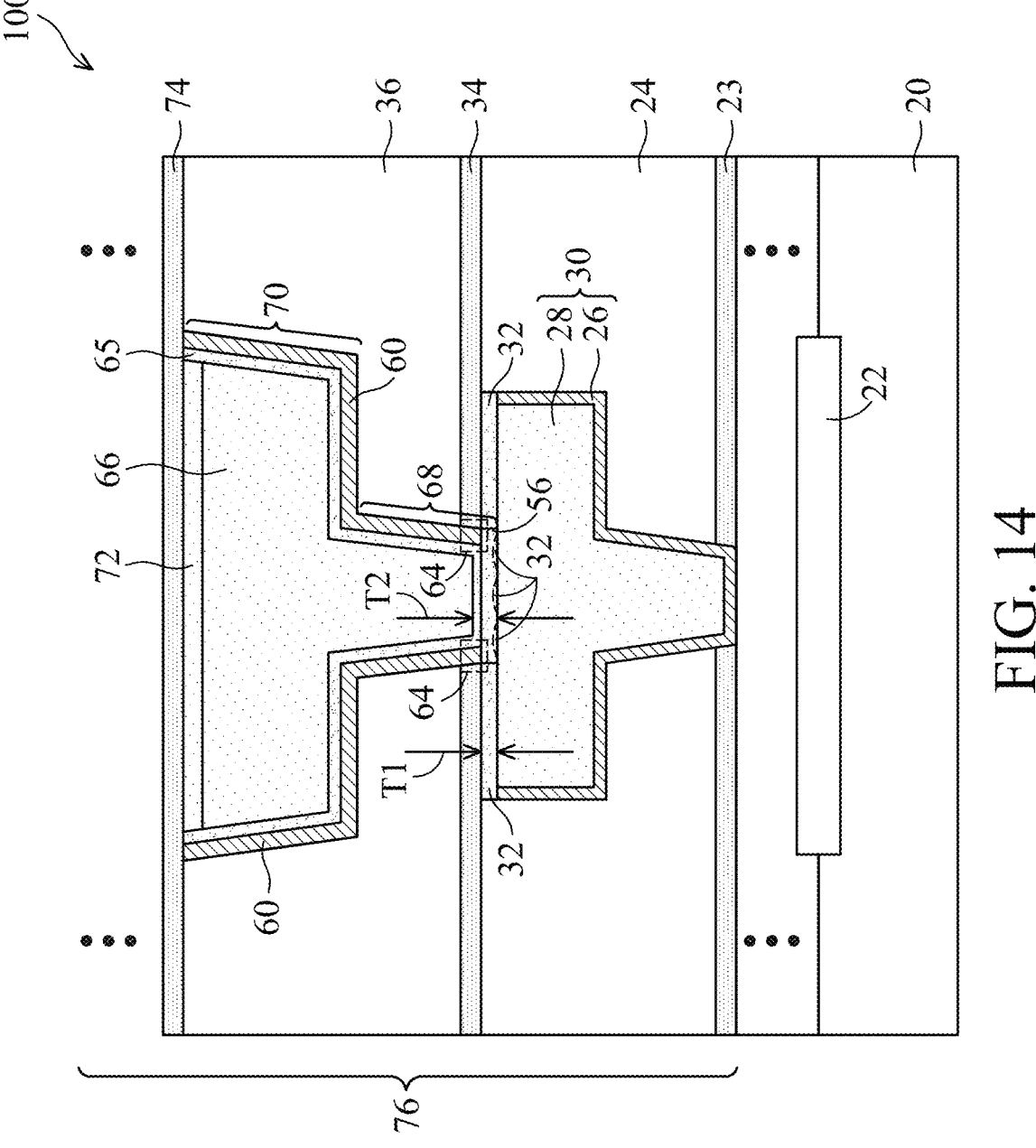
FIG. 14 illustrates a cross-sectional view of an interconnect structure in accordance with some embodiments.

In accordance with some embodiments, as shown in FIG. 13, metal cap 56 has a same thickness as metal cap 32. In accordance with alternative embodiments, the thickness of metal cap 56 is different from the thickness of metal cap 32. For example, as shown in FIG. 14, the thickness T2 of metal cap 56 is smaller than the thickness T1 of metal cap 32. In accordance with alternative embodiments, the thickness T2 of metal cap 56 may be greater than the thickness T1 of metal cap 32.

FIGS. 13 and 14 also illustrate some embodiments in which metal cap 32 has some portions remaining after the process as shown in FIG. 6. For example, as shown in FIGS. 13 and 14, some discrete portions of metal cap 32 may remain, and may be separated from each other by metal cap 56. Furthermore, the discrete portions of metal cap 32 may be spaced apart from the un-etched portions of metal cap 32. Also, in other embodiments, metal cap 32 may be thinned but not etched-through, as shown in FIG. 6. In the resulting structure, metal cap 56 will be fully separated from metal conductive feature 30 by the thinned metal cap 32.

The embodiments of the present disclosure have some advantageous features. By re-depositing a metal cap before the selective formation of the inhibitor film and the conductive barrier, the inhibitor film may be formed better and more uniform, and the selectivity in the formation of the conductive barrier is improved.

In accordance with some embodiments of the present disclosure, a method comprises forming a first conductive feature in a first dielectric layer; forming a first metal cap over and contacting the first conductive feature; forming an etch stop layer over the first dielectric layer and the first metal cap; forming a second dielectric layer over the etch stop layer; etching the second dielectric layer and the etch stop layer to form an opening, wherein the first conductive feature is exposed to the opening; selectively depositing a second metal cap at a bottom of the opening; forming an inhibitor film at the bottom of the opening and on the second metal cap; selectively depositing a conductive barrier in the opening; removing the inhibitor film; and filling remaining portions of the opening with a conductive material to form a second conductive feature. In an embodiment, the inhibitor film comprises carbon and hydrogen. In an embodiment, after the etch stop layer is etched, the first metal cap is at least thinned. In an embodiment, after the etch stop layer is etched, the first metal cap is etched-through, and at least a portion of a top surface of the first conductive feature is exposed. In an embodiment, after the etch stop layer is etched, the first metal cap is thinned, and after the second metal cap is selectively deposited, the second metal cap is fully separated from the first conductive feature by the thinned first metal cap. In an embodiment, the selectively depositing the second metal cap comprises depositing a same material as the first metal cap. In an embodiment, the selectively depositing the second metal cap comprises depositing a different material than the first metal cap. In an embodiment, the removing the inhibitor film comprises a baking process. In an embodiment, the second metal cap has a thickness smaller than a thickness of the first metal cap. In an embodiment, both of the forming the first metal cap and the selectively depositing the second metal cap comprise depositing cobalt.

In accordance with some embodiments of the present disclosure, a structure comprises a first conductive feature comprising a top surface, wherein the top surface comprises a first portion and a second portion; a first metal cap over and contacting the first portion of the top surface; a second metal cap overlapping the second portion of the top surface; an etch stop layer over and contacting the first metal cap; a dielectric layer over the etch stop layer; and a second conductive feature in the etch stop layer and the dielectric layer, wherein the second conductive feature is over and contacting the second metal cap. In an embodiment, the second conductive feature comprises a conductive barrier; and a conductive region encircled by the conductive barrier, wherein the conductive region physically contacts the second metal cap. In an embodiment, the conductive barrier comprises tantalum. In an embodiment, a bottom edge of the conductive barrier is spaced apart from, and is higher than, the second metal cap. In an embodiment, the conductive region comprises a liner layer comprising cobalt; and a copper region on the liner layer. In an embodiment, the first metal cap and the second metal cap comprise a same material, and have a distinguishable interface in between. In an embodiment, the first metal cap has a first thickness equal to or greater than a second thickness of the second metal cap.

In accordance with some embodiments of the present disclosure, a structure comprises a first conductive feature; a first metal cap over and contacting the first conductive feature a second metal cap over and contacting the first conductive feature, wherein the first metal cap and the second metal cap are in contact with each other to form a distinguishable interface; a dielectric layer over and in contact with the first metal cap; and a second conductive feature over and contacting the second metal cap. In an embodiment, the second conductive feature comprises a conductive barrier, wherein an outer edge of the conductive barrier are vertically aligned to the distinguishable interface; and a conductive region encircled by the conductive barrier, wherein the conductive region physically contacts the second metal cap. In an embodiment, the first metal cap and the second metal cap have different thicknesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first conductive feature in a first dielectric layer;
forming a first metal cap over and contacting the first conductive feature;
forming an etch stop layer over the first dielectric layer and the first metal cap;
forming a second dielectric layer over the etch stop layer;
etching the second dielectric layer and the etch stop layer to form an opening, wherein a part of the first metal cap is exposed to the opening, wherein a first portion of the part of the first metal cap is etched-through, so that the first conductive feature is exposed to the opening, and a second portion of the part of the first metal cap remains under the opening;
selectively depositing a second metal cap at a bottom of the opening, wherein the second metal cap comprises a first bottom surface contacting the first conductive feature, and a second bottom surface contacting the second portion of the part of the first metal cap;
forming an inhibitor film at the bottom of the opening and on the second metal cap;
selectively depositing a conductive barrier in the opening;
removing the inhibitor film; and
filling remaining portions of the opening with a conductive material to form a second conductive feature, wherein both of the second conductive feature and the conductive barrier physically contacts a top surface of the second metal cap.

2. The method of claim 1, wherein the inhibitor film comprises carbon and hydrogen.

3. The method of claim 1, wherein after the etch stop layer is etched, the second portion of the first metal cap is thinned.

4. The method of claim 3, wherein after the etch stop layer is etched, the first metal cap is etched-through, and at least a portion of a top surface of the first conductive feature is exposed.

5. The method of claim 1, wherein the selectively depositing the second metal cap comprises depositing a same material as the first metal cap.

6. The method of claim 1, wherein the selectively depositing the second metal cap comprises depositing a different material than the first metal cap.

7. The method of claim 1, wherein the removing the inhibitor film comprises a baking process.

8. The method of claim 1, wherein the second metal cap has a thickness smaller than a thickness of the first metal cap.

9. The method of claim 1, wherein both of the forming the first metal cap and the selectively depositing the second metal cap comprise depositing cobalt.

10. A method comprising:
forming a first conductive feature in a first dielectric layer;
forming a first metal cap and a second metal cap over and contacting a first portion and a second portion, respectively, of a top surface of the first conductive feature, wherein the second metal cap comprises:
a first part over and contacting a part of the first metal cap; and
a second part overlapping and contacting the top surface of the first conductive feature;
forming an etch stop layer over the first dielectric layer;
forming a second dielectric layer over the etch stop layer; and
forming a second conductive feature in the etch stop layer and the second dielectric layer, wherein the second conductive feature is over and contacting the second metal cap, and wherein the forming the second conductive feature comprises:
depositing a conductive barrier; and
depositing a conductive region encircled by the conductive barrier, wherein the conductive region and the conductive barrier are in physical contact with a top surface of the second metal cap.

11. The method of claim 10, wherein the conductive barrier comprises tantalum.

12. The method of claim 10, wherein a bottom edge of the conductive barrier is spaced apart from, and is higher than, the first metal cap and the second metal cap.

13. The method of claim 10, wherein the depositing the conductive region comprises:
depositing a liner layer comprising cobalt; and
depositing a copper region on the liner layer.

14. The method of claim 10, wherein the first metal cap and the second metal cap comprise a same material, and have a distinguishable interface in between.

15. The method of claim 10, wherein the first metal cap has a first thickness equal to or greater than a second thickness of the second metal cap.

16. A method comprising:
forming a first metal cap over and contacting a first conductive feature;
forming a second metal cap over and contacting the first conductive feature, wherein the first metal cap and the second metal cap are in contact with each other to form a distinguishable interface, and wherein in a cross-sectional view of the second metal cap and the first metal cap, the second metal cap comprises opposing portions on opposing sides of a part of the first metal cap, and the opposing portions are in contact with the first conductive feature;
forming a dielectric layer over and in contact with the first metal cap; and
forming a second conductive feature over and contacting the second metal cap, wherein the forming the second conductive feature comprises:

forming a conductive barrier, wherein an outer edge of the conductive barrier is vertically aligned to the distinguishable interface; and forming a conductive region encircled by the conductive barrier, wherein the conductive region physically contacts the second metal cap.

17. The method of claim 16, wherein the first metal cap and the second metal cap have different thicknesses.

18. The method of claim 1, wherein the first metal cap is in the first dielectric layer.

19. The method of claim 10, wherein the first metal cap is in the first dielectric layer.

20. The method of claim 16 further comprising forming an additional dielectric layer, wherein both of the first metal cap and the first conductive feature are in the additional dielectric layer.

* * * * *